United States Patent
Tsai et al.

(10) Patent No.: US 6,413,685 B1
(45) Date of Patent: Jul. 2, 2002

(54) METHOD OF REDUCING OPTICAL PROXIMITY EFFECT

(75) Inventors: Kao-Tsair Tsai, Kaohsiung; Li-Mimg Wang, Taoyuan Hsien, both of (TW)

(73) Assignee: Winbond Electronics Corp., Hsinchu (TW)

(*) Notice: Subject to any disclaimer, the term of this patent is extended or adjusted under 35 U.S.C. 154(b) by 26 days.

(21) Appl. No.: 09/626,404

(22) Filed: Jul. 26, 2000

(30) Foreign Application Priority Data

May 15, 2000 (TW) ........................ 89109227 A

(51) Int. Cl.$^7$ ................................. G03F 9/00
(52) U.S. Cl. ........................................ 430/5
(58) Field of Search ................ 430/5, 322, 394, 430/311

(56) References Cited

U.S. PATENT DOCUMENTS 6,168,904 B1 * 1/2001 Cuthbert et al. .......... 430/5

* cited by examiner

Primary Examiner—S. Rosasco
(74) Attorney, Agent, or Firm—Ladas & Parry

(57) ABSTRACT

A method of reducing the optical proximity effect of an exposed etch pattern occurred during a conventional photolithography process, wherein a primary pattern according to the present invention is first divided into a plurality of sub-patterns. Each of the sub-patterns formed on a photomask is then exposed under a light source to be sequentially transferred onto a corresponding photoresist layer during a photolithography process. Subsequently, the operating parameters of a stepper used in the photolithography process such as numerical perture, coherence, intensity of energy, and intensity of light are set according to the charts as shown in FIG. 5A, 5B, 6A, 6B, and 6C to obtain desirable critical dimensions, thereby reduces the optical proximity effect. Therefore, an etch pattern with different line pitches can be successfully transferred onto a photoresist layer with each critical dimension of the different line pitches accurately met according to the present invention.

10 Claims, 5 Drawing Sheets

METHOD OF REDUCING OPTICAL PROXIMITY EFFECT

BACKGROUND OF THE INVENTION

1. Field of the Invention

The present invention relates to a method of reducing an optical proximity effect; more particularly, the present invention relates to an improved photolithography method for reducing the optical proximity effect of an exposed pattern which occurred during a conventional photolithography process.

2. Description of the Prior Art

In recent years, the size of a semiconductor device has been decreased as in proportion to the developments of the semiconductor IC design rule and the photolithography technology. For example, most of the semiconductor photolithography processes nowadays apply the latest i-line or deep ultra violet (DUV) photolithography system to fabricate semiconductor devices of extremely small dimensions. However, if the linewidth of the fabricated integrated circuits (IC) in a semiconductor device is equal to or smaller than the wavelength of a light source provided for carrying through the photolithography processes, the optical proximity effect emerges such that an incorrect or undesirable exposed pattern size on a photoresist layer is obtained. Further, the allowable critical dimension tolerance according to the conventional photolithography process is decreased because of the optical proximity effect, which inevitably increases the complexity of said photolithography process.

The so-called optical proximity effect (OPE) is an optical condition in which an undesirable pattern transfer (for example, a pattern shrinkage) is performed during a conventional photolithography process. Said undesirable pattern transfer involves incorrectly projecting an etch pattern of a photomask onto a photoresist layer by a stepper, which is generally caused by a light reflection, refraction, or diffraction effect which occurred during the photolithography process. Referring to FIG. 1, a top view of an undesirable pattern transfer formed by a conventional photolithography process affected by the OPE is shown, wherein the etch pattern 10 of a photomask does not exactly correspond to the exposed pattern 12 of a photoresist layer. The sharp corners of the etch pattern 10 of the photomask (not shown) become rounded after being projected onto the photoresist layer (not shown) because scattering light blurs out the distinct edges and corners of the mask pattern 10. As a consequence, normal operations of the IC formed based on the incorrectly exposed pattern 12 may be adversely affected.

Typically, the optical proximity effect can be partially compensated by amending the patterns on the photomask. For example, if it is known that an image formed on a photoresist layer is narrower than the desired pattern, the pattern on the photomask may be designed to be wider than the original size. Referring to FIG. 2, the top view of a partially compensated pattern is shown constituting the etch pattern 20 of a photomask. Then, a plurality of pattern-correcting hammerheads 24, which are collectively called a mask bias, are added to the corner edges of the photomask pattern 20 as shown in FIG. 2. Subsequently, the photomask pattern 20 is exposed under the light source of a stepper (not shown) to be transferred onto a photoresist layer (not shown) during a photolithography process so that an accurate exposed pattern 22 is formed. As described above, the hammerheads 24 are added to the corner edges of the etch pattern 20 of a photomask to increase the corner areas of the exposed pattern 22. Thus, the exposed pattern 22 on the photoresist layer is sufficiently compensated by employing the mask bias to correct the pattern shrinkage phenomenon caused by scattering light. Thereafter, a relevant data set containing all parameter corrections of the etch pattern 20 on a photomask as well as other parameters used for optimizing a photolithography process are entered into a computer as a database for correcting more photolithography processes and photomask etch patterns. It is called auto optical proximity correction (OPC).

In addition, other conventional methods for reducing the optical proximity effect also include a method of adjusting the stepper used in a conventional photolithography process so that the aperture, coherence, intensity of energy, and/or contrast of an exposed pattern on a photoresist layer are optimized to meet the requirements of critical dimensions.

However, since the line width or the line pitch that defines the IC layout of a semiconductor device has been decreased to a point that the space between these line widths may not be sufficient for the hammerheads to be added to. Thus, the corrections made by these compensated patterns 20 on the photomasks, as described above, are limitative such that further development of the photolithography technology is restricted by the extent of the mask bias.

Moreover, since integrated circuits (IC) of different line pitches are almost always integrated on a same semiconductor device or chip, it is therefore very difficult to transfer an etch pattern with different line pitches onto a photoresist layer while trying to meet the critical dimensions of all line pitches by simply adjusting the numerical aperture, coherence, intensity of energy, and/or contrast of a stepper.

SUMMARY OF THE INVENTION

Accordingly, it is an object of the present invention to provide a method of reducing an optical proximity effect (OPE) without using any additional mask bias to transfer an etch pattern from a photomask to a photoresist layer more precisely during a photolithography process; in addition, the OPEs inherent to the different line pitches of an exposed pattern on a photoresist layer are compensated by adjusting the operating parameters of a stepper such as the numerical aperture, coherence, intensity of energy, and/or contrast.

To achieve the above-described object, the present invention provides a method of reducing the OPE by dividing an etch pattern that corresponds to the IC layout pattern of a semiconductor device into a plurality of sub-patterns, wherein each of the sub-patterns comprises a portion of the etch pattern having a particular line pitch. Then, a plurality of such sub-patterns are each formed on a corresponding photomask to be sequentially transferred to a photoresist layer during a photolithography process to complete an overall exposed pattern.

Moreover, the method of reducing the OPE according to the present invention is comprised of the following steps. First, a primary pattern that corresponds to the overall IC layout pattern of a semiconductor device is provided. The primary pattern is then divided into a plurality of sub-patterns each comprising a portion of the primary pattern having a particular line pitch. Subsequently, a plurality of such sub-patterns are each formed on a corresponding photomask to be sequentially transferred to a photoresist layer by means of a stepper during a photolithography process to complete an overall exposed pattern. A light source is provided by the stepper so that the sub-patterns formed on corresponding photomasks can be transferred sequentially onto the photoresist layer by passing the light from the light source through the photomasks.

It is noted that since each sub-pattern is comprised of a portion of the primary pattern formed on a corresponding photomask having a particular line pitch according to the present invention, the OPE inherent to each of the sub-patterns thus can be suitably compensated by adjusting the values of numerical aperture, coherence, intensity of energy, and/or contrast to individually meet the critical dimension of each sub-pattern. Therefore, an etch pattern with different line pitches can be successfully transferred onto a photoresist layer with each critical dimension of the different line pitches accurately met according to the present invention.

BRIEF DESCRIPTION OF THE DRAWINGS

The present invention will become more fully understood from the detailed description given hereinbelow and the accompanying drawings, given by way of illustration only and thus not intended to be limitative of the present invention, in which.

DETAILED DESCRIPTION OF THE INVENTION

Figure 1:
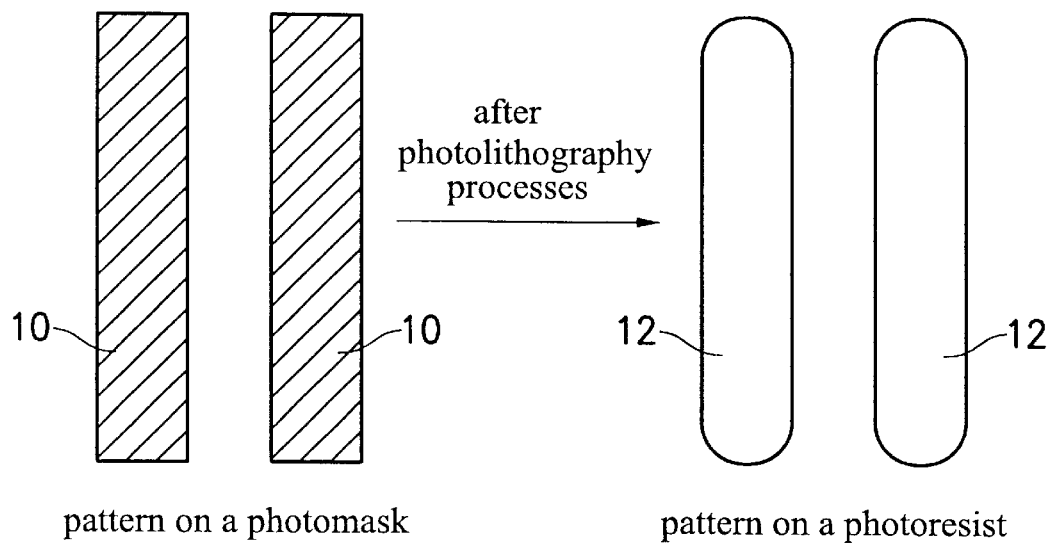
FIG. 1 is a top view of an undesirable pattern transfer formed by a conventional photolithography process affected by an optical proximity effect (OPE)
Figure 2:
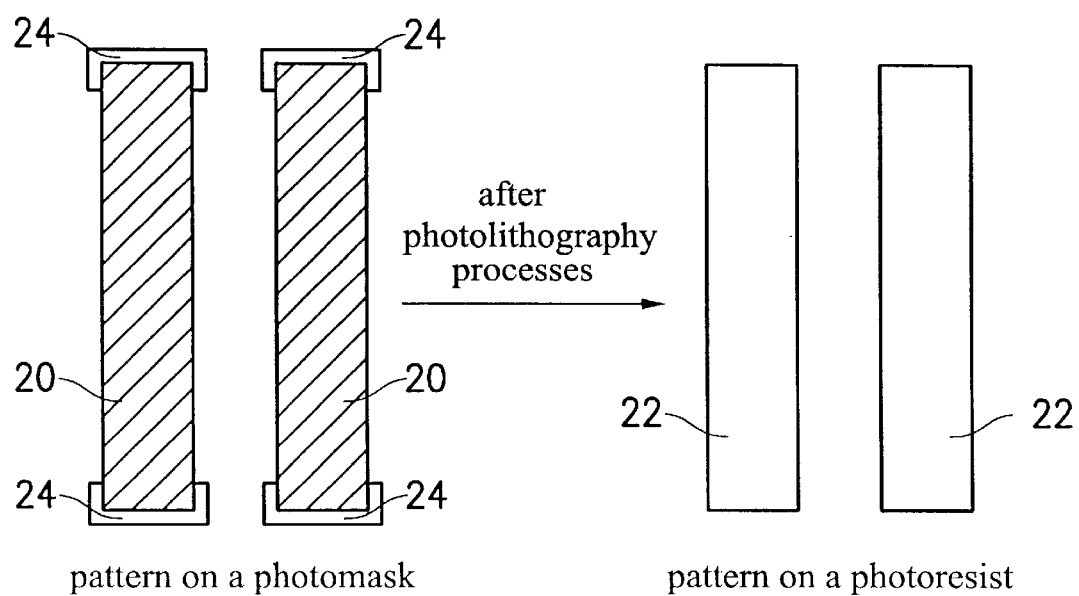
FIG. 2 is a top view of a compensated etch pattern on a photomask with a plurality of additional hammerheads formed thereto according to another conventional photolithography method.
Figure 3A:
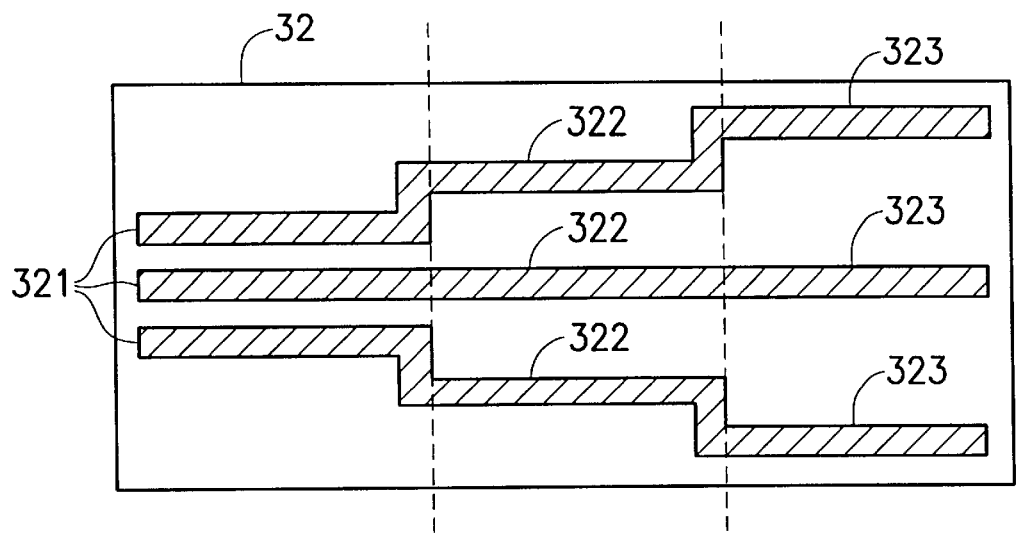
FIGS. 3A and 3B show the top views of a primary pattern and thereof a plurality of sub-patterns according to the present invention.
Figure 3B:
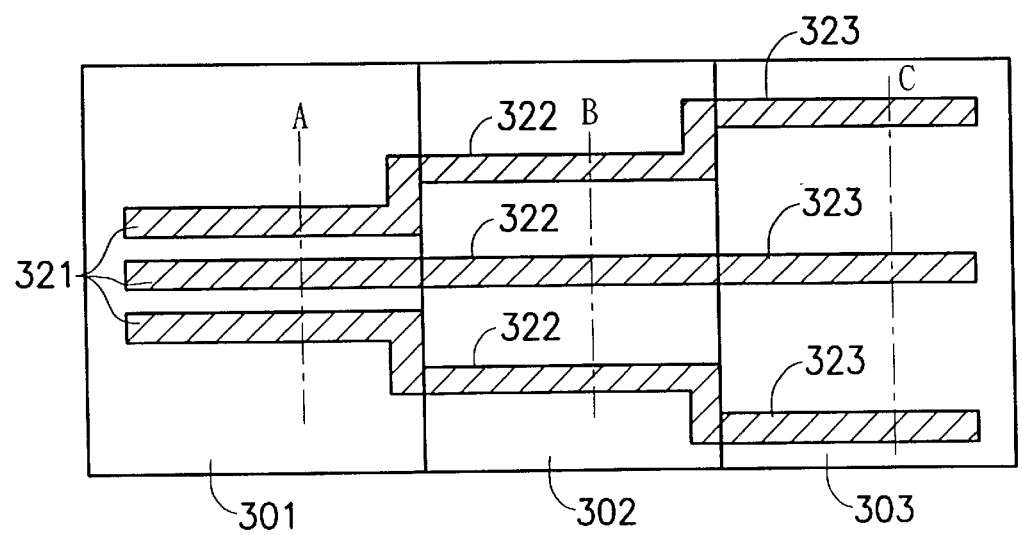

Referring to FIGS. 3A and 3B, FIGS. 3A and 3B show the top views of a primary pattern and thereof a plurality of sub-patterns based on particular line pitches, and each sub-pattern represents a portion of the primary pattern formed on a photomask which has a same particular line pitch. For example, as shown in FIG. 3A, a primary pattern 32 is divided into three sub-patterns 321, 322, and 323 based on such line pitch classifications as dense, mid-dense, and loose, respectively. Subsequently, as shown in FIG. 3B, said sub-patterns 321, 322, and 323 are each formed on respective photomasks 301, 302, and 303. Accordingly, a photomask with the primary pattern 32 formed thereon is provided, and said primary pattern 32 is typically drawn with a CAD (Computer Aided Design) tool by an IC layout designer. However, it is possible to sort out the line pitches contained in the primary pattern 32 with the help of a CAD tool and form a plurality of sub-patterns directly such as the sub-patterns 321, 322, and 323. Each of the sub-patterns 321, 322, and 323 of a particular line pitch is then formed on a photomask such as the photomasks 301, 302, and 303, respectively, according to the present invention. In addition, the present invention is not limited to the size or number configuration of the photomasks given herein as perferred embodiments; modifications or variations to the configuration of the aforementioned sub-patterns as suited to particular applications are within the scope of the present invention.

Furthermore, the photomasks 301, 302, and 303 are each separately exposed under the light source of a stepper (not shown) to be transferred onto a photoresist layer (not shown) in sequence to complete a photolithography process. In particular, different critical dimensions (CD) of all the different line pitches contained in the primary pattern 32 are met through separate optimization of such operating parameters as the numerical aperture, coherence, intensity of energy, and/or contrast of the stepper for each of the sub-patterns 321, 322, and 323 according to the method of the present invention.

Figure 4A:
FIGS. 4A and 4B show a plurality of photo-etched positive and negative photoresist layers, respectively, formed by processing the sub-patterns of respective photomasks shown in FIG. 3B that are exposed in corresponding photolithography processes.
Figure 4A:
Figure 4A:
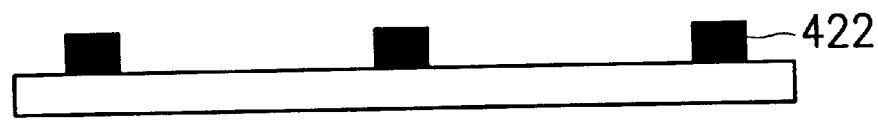
Figure 4B:
Figure 4B:
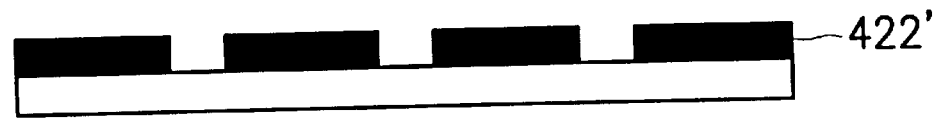
Figure 4B:
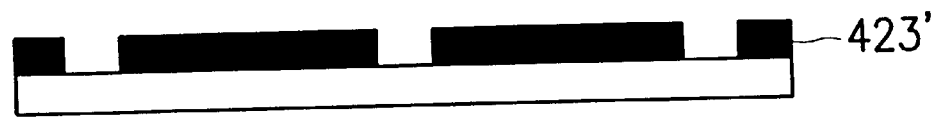

FIGS. 4A and 4B, respectively, show a plurality of photo-etched positive photoresist layers and negative photoresist layers formed by processing the aforementioned sub-patterns 321, 322, and 323 of respective photomasks exposed in corresponding photolithography processes. Referring to FIG. 4A, the cross sectional view of each of the photo-etched positive photoresist layers 421, 422, and 423 is shown taken along the dividing lines A—A, B—B, C—C of the primary pattern shown in FIG. 3B, respectively, and the cross sectional view of each of the photo-etched negative photoresist layers 421', 422', and 423' taken along the dividing lines A—A, B—B, C—C of the primary pattern, respectively, is shown in FIG. 4B.

Figure 5A:
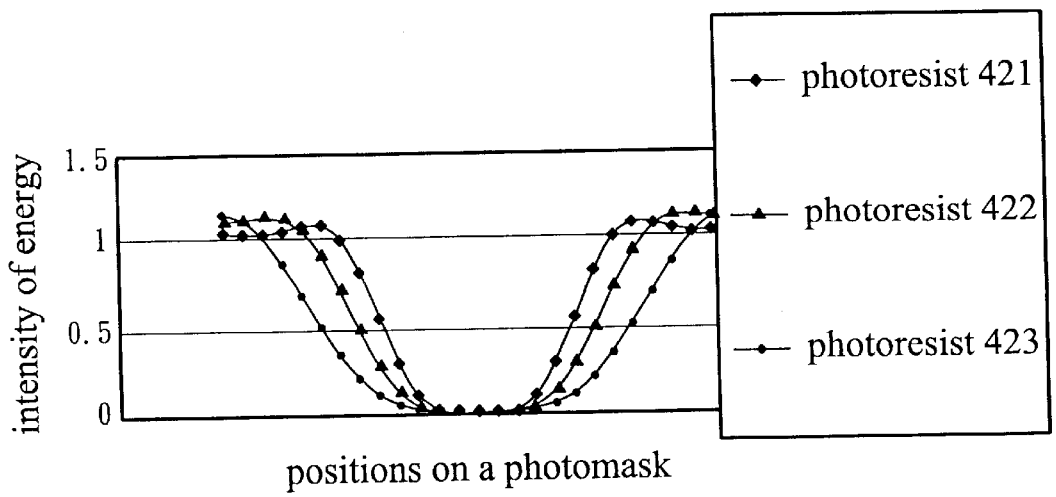
FIGS. 5A and 5B are charts in which the intensity of energy required for the proper forming of each of the photo-etched positive and negative photoresist layers, respectively, are plotted against relative positions across the surface of each respective photoresist layer.
Figure 5B:
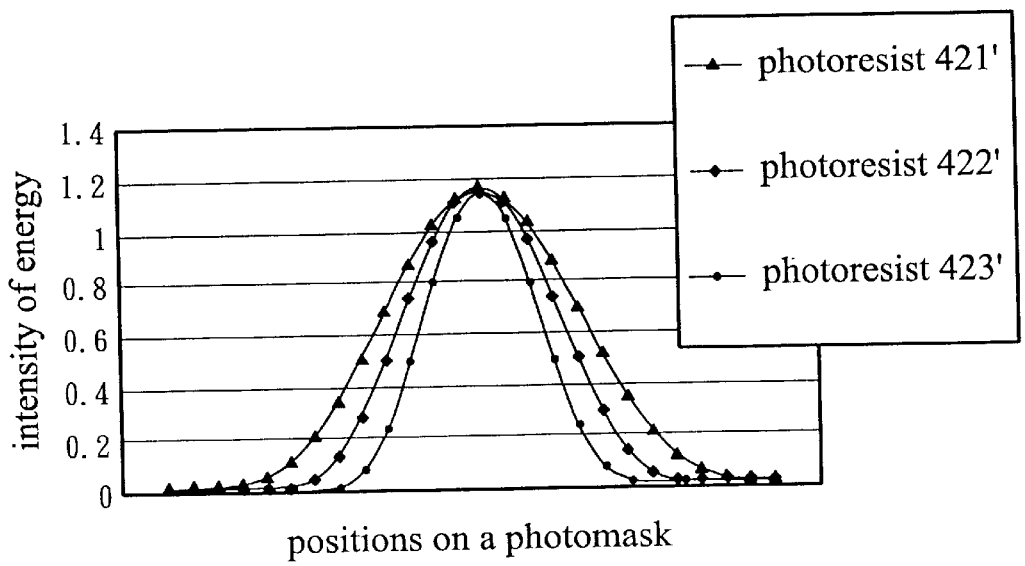

Referring to FIGS. 5A and 5B, FIG. 5A shows a chart in which the intensity of energy required for the proper forming of each of the photo-etched positive photoresist layers 421, 422, and 423 is plotted against relative positions across the surface of each respective positive photoresist layer, and FIG. 5B shows a chart in which the intensity of energy required for the proper forming of each of the photo-etched negative photoresist layers 421', 422', and 423' is plotted against relative positions across the surface of each respective negative photoresist layer. Thus, an appropriate intensity of energy can be quickly referred to by following the curves of the charts shown in FIG. 5A and 5B.

Figure 6A:
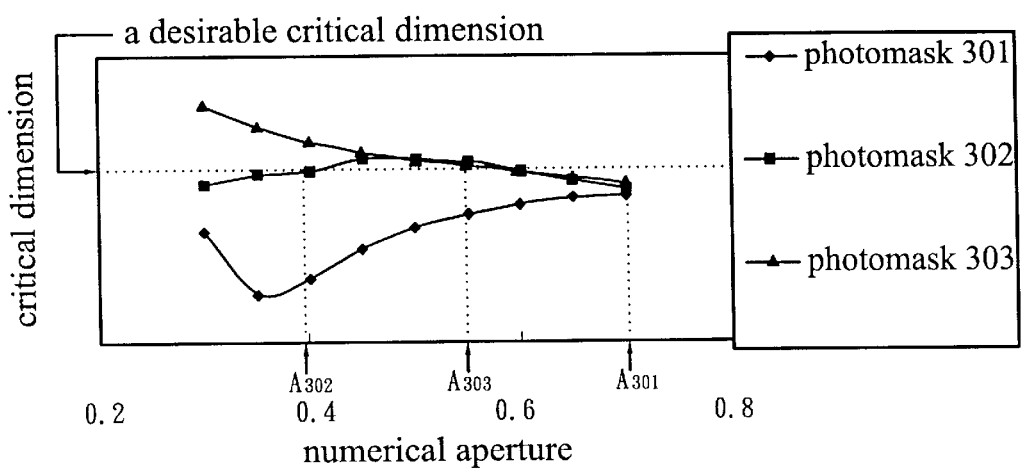
FIGS. 6A, 6B, and 6C are charts in which the numerical aperture, coherence, and intensity of a light source is plotted against the critical dimensions of each of the sub-patterns formed according to the present invention.

Referring to FIG. 6A, FIG. 6A is a chart in which the numerical aperture that controls the exposure amount of a photomask under a light source is plotted against the critical dimensions of each of the sub-patterns 301, 302, and 303 formed. Wherein, each of the photo-etched positive photoresist layers 421, 422, and 423 is formed by exposing one of the photomasks 301, 302, and 303 at a corresponding numerical aperture $A_{301}$, $A_{302}$, and $A_{303}$, respectively, in order to obtain desirable critical dimensions as shown in FIG. 6A.

Figure 6B:
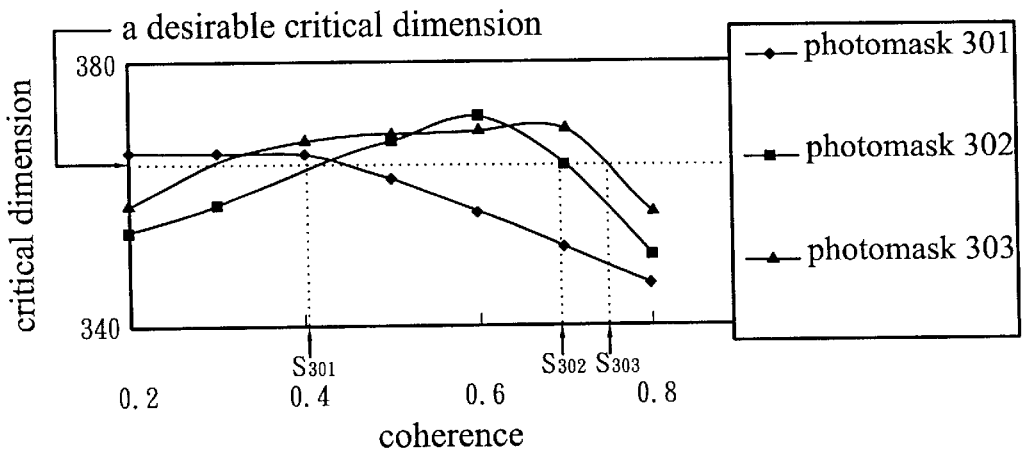

Referring to FIG. 6B, FIG. 6B is a chart in which the coherence of a light source is plotted against the critical dimensions of each of the sub-patterns 301, 302, and 303 formed. Wherein, each of the photo-etched positive photoresist layers 421, 422, and 423 is formed by exposing one of the photomasks 301, 302, and 303 at a corresponding coherence value $S_{301}$, $S_{302}$, and $S_{303}$, respectively, in order to obtain desirable critical dimensions as shown in FIG. 6B.

Figure 6C:
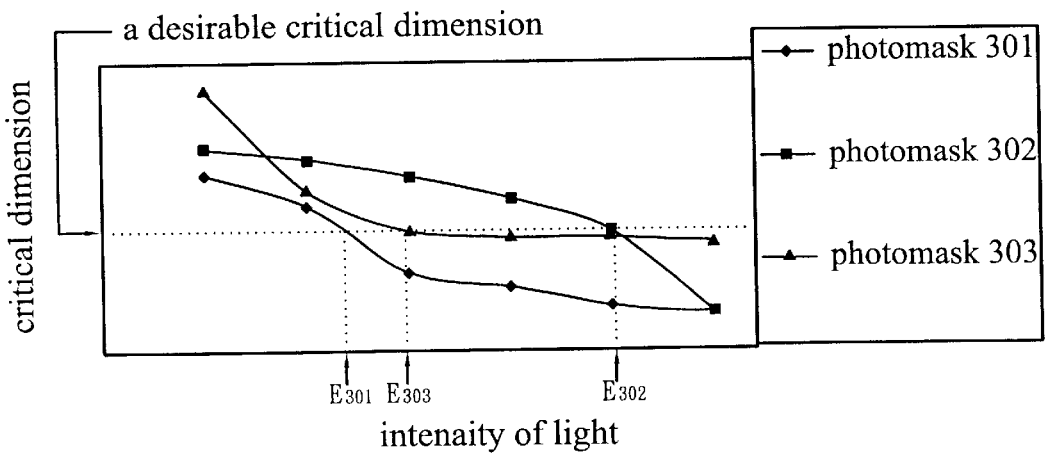

Referring to FIG. 6C, FIG. 6C is a chart in which the intensity of a light source is plotted against the critical dimensions of each of the sub-patterns 301, 302, and 303 formed. Wherein, each of the photo-etched positive photoresist layers 421, 422, and 423 is formed by exposing one of the photomasks 301, 302, and 303 at a corresponding light intensity value $E_{301}$, $E_{302}$, and $E_{303}$, respectively, in order to obtain desirable critical dimensions as shown in FIG. 6C.

Thus, a primary pattern according to the present invention is first divided into a plurality of sub-patterns. Each of the sub-patterns formed on a photomask is then exposed under a light source to be sequentially transferred onto a corresponding photoresist layer during a photolithography process. Subsequently, the operating parameters of a stepper used in the photolithography process such as numerical aperture, coherence, intensity of energy, and intensity of light are set according to the charts as shown in FIGS. 5A, 5B, 6A, 6B, and 6C to obtained desirable critical dimensions, thereby reduces the optical proximity effect. Therefore, an etch pattern with different line pitches can be successfully transferred onto a photoresist layer with each critical dimension of the different line pitches accurately met according to the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of reducing the optical proximity effect occurring during a photolithography process for etch patterns dividable into a plurality of sub-patterns each having a same or similar line pitch, comprising the steps of:

providing a plurality of photomasks; and forming each of said sub-patterns on a corresponding photomask with a same or similar line pitch.

2. The method as claimed in claim 1, further comprising the step of providing a light source.

3. The method as claimed in claim 2, further comprising the step of providing a plurality of photoresist layers such that each sub-pattern formed on a corresponding photomask is transferred onto a corresponding photoresist layer in sequence by sequentially exposing each of said photomasks under a light source.

4. The method as claimed in claim 3, wherein the intensity of light is set according to the line pitch of the sub-pattern on a corresponding photomask.

5. The method as claimed in claim 1, further comprising the step of adjusting an operating parameter of a stepper used in the photolithography process, said operating parameter including one of numerical aperture, coherence, and intensity of energy.

6. The method as claimed in claim 5, wherein said operating parameter is set according to said line pitch of each of said sub-patterns on said corresponding photomask.

7. A method of reducing the optical proximity effect, comprising the steps of:

providing a primary pattern;

dividing the primary pattern into a plurality of sub-patterns;

forming each of the sub-patterns on a corresponding photomask, wherein each of the sub-pattern is a portion of the primary pattern having a same or similar line pitch;

providing a light source; and providing a photoresist layer such that each sub-pattern formed on a corresponding photomask is transferred onto a corresponding photoresist layer in sequence by sequentially exposing each of said photomasks under a light source.

8. The method as claimed in claim 5, wherein the intensity of light is set according to the line pitch of the sub-pattern on said corresponding photomask.

9. The method as claimed in claim 7, further comprising the step of adjusting an operating parameter of a stepper used in the photolithography process, said operating parameter including one of numerical aperture, coherence, and intensity of energy.

10. The method as claimed in claim 9, wherein said operating parameter is set according to said line pitch of each of said sub-pattern on said corresponding photomask.

* * * * *